Sept. 3, 1963 H. DA COSTA 3,102,331

FEEDING AND POSITIONING APPARATUS

Filed July 21, 1960 5 Sheets-Sheet 1

INVENTOR.
Harry da Costa,
BY Mueller & Aichele
Att'ys.

Sept. 3, 1963

H. DA COSTA 3,102,331

FEEDING AND POSITIONING APPARATUS

Filed July 21, 1960

5 Sheets-Sheet 2

INVENTOR.
Harry da Costa,
BY
Mueller & Aichele
Att'ys.

INVENTOR.
Harry da Costa,
BY Mueller & Aichele
Att'ys.

Sept. 3, 1963 H. DA COSTA 3,102,331

FEEDING AND POSITIONING APPARATUS

Filed July 21, 1960 5 Sheets-Sheet 4

INVENTOR.
Harry da Costa,
BY Mueller & Aichele
Atty's.

FEEDING AND POSITIONING APPARATUS

Filed July 21, 1960

INVENTOR.
Harry da Costa,
BY Mueller & Aichele
Atty's.

United States Patent Office 3,102,331
Patented Sept. 3, 1963

3,102,331

FEEDING AND POSITIONING APPARATUS

Harry da Costa, Phoenix, Ariz., assignor to Motorola, Inc., Chicago, Ill., a corporation of Illinois Filed July 21, 1960, Ser. No. 44,408
9 Claims. (Cl. 29—203)

This invention relates to apparatus for supplying miniature pieces and assemblies to a work area at which they are to be assembled, tested or otherwise acted on, and for positioning such pieces and assemblies in certain relations at the work area.

The apparatus of the invention is particularly adapted for use with a bonding machine which attaches microminiature contact wires to a semiconductor body of the type used in transistors. The present invention will be described and illustrated herein as it is applied to the manufacture of certain high frequency transistors and high speed switching transistors, although its utility is not restricted to this particular application.

In the fabrication of such transistors, a semiconductor die is provided with base and emitter contacts which are typically from 1 to 1.5 mils wide and from 2 to 12 mils long. These contacts are so small that the lead wires which are ordinarily provided for transistor units cannot be directly connected to the contacts. Instead, electrical connections between the base and emitter contacts of the die unit and the respective lead wires are established by tiny contact wires or filaments which have a diameter of about one-seventh the diameter of a human hair. One end of a contact wire is bonded to a contact on the semiconductor die, and the other end of the wire is bonded to a corresponding lead. The bonding is accomplished in a thermal-compression bonding machine as mentioned above. Prior to the time the contact wires are bonded, the die unit and the lead wires are mounted on a base called a header, and the resulting assembly will be referred to herein as a header assembly.

In order to maximize the speed of the bonding operation, it is desirable to provide the bonding machine with apparatus which supplies the header assemblies in succession to the bonding tool, and which establishes the assemblies in exactly located positions for receiving the contact wires. Efforts to provide commercially acceptable apparatus for accomplishing these feeding and positioning functions have met with several difficulties. The header assemblies are small and delicate, and the structure for feeding and positioning them must handle the units gently in order to avoid damaging them. A typical header assembly of this type has a body with a diameter of about .18 inch and a height of about .18 inch. The semiconductor die which is mounted on the body of the header may be about .025 inch square and about .003 inch thick, and the dimensions of the contacts on the die have been stated above. The minuteness and delicacy of the header assemblies are apparent from these dimensions.

Any substantial contamination of the contacts on the semiconductor die or the leads of the header assemblies makes it impossible to produce a satisfactory bond between a contact wire and the contact or lead. Therefore, care must be exercised in order to maintain cleanliness of the assemblies and the apparatus which feeds and positions them. Also, each assembly must be heated in the feeding apparatus in order to satisfactorily bond the contact wires to it by thermal-compression techniques. These requirements for cleanliness and heating mean that it is not practical to use lubricating materials on the mechanism which handles the assemblies, because lubricant materials and vapors from them produced by heating can easily contaminate the areas to be bonded. Also, the heating of the non-lubricated apparatus increases the danger of jamming or sticking of working parts, and this, of course, greatly slows down the work. Known feeding and positioning apparatus has been found to be more susceptible to jamming and sticking of working parts than is desired.

Also, the time required to load the apparatus with header assemblies has been excessive. Part of the time for loading has been spent in locating each header assembly initially in a specific angular position on a carrier, and in attaching individual retainers for each assembly in place so as to maintain the assemblies in the proper initial position.

Accordingly, it is an object of the present invention to provide improved apparatus for carrying miniature assemblies to a work area and for positioning them with respect to parts or pieces to be assembled thereto, which apparatus can be loaded quickly and operates smoothly without jamming or sticking.

Another object of the invention is to provide a carrier for feeding subassemblies of semiconductor devices into a bonding machine which is constructed such that each semiconductor assembly can be loaded on the carrier in any orientation and all of the assemblies can be retained in place by a single retainer element, thus reducing the time required for loading the carrier as compared to known apparatus.

A further object of the invention is to provide a feeding system which supplies assemblies for semiconductor devices to a work area with a mechanism for rotationally positioning the assemblies at the work area which does not apply unbalanced sidewise acting forces to the assemblies or to carrier parts associated with them and thereby minimizes the risk of jamming.

A feature of the invention is the provision of a carrier unit for a feeding and positioning system in which miniature assemblies are carried individually on rotary members and are sandwiched between a pair of elongated strips so constructed that one strip supports the rotary members, and the other strip retains all of the assemblies on the rotary members and is detachable so that the assemblies can be loaded on the carrier quickly.

Another feature of the invention is the provision of a feeding and positioning system with a rigid carrier unit having a number of spaced gear-like rotary members for receiving assemblies of semiconductor devices and carrying them along a straight track in an assembly machine to a work area, and a positioning mechanism in the machine including gears which engage the rotary members individually when they reach the work area for rotating the assemblies to proper positions for receiving pieces to be assembled thereto. The gears apply balanced forces on opposite sides of the rotary members, and this in conjunction with the straight-through nature of the feed and the rigidity of the carrier unit provides freedom from jamming or sticking.

A further feature of the invention is the provision of a feeding and positioning system for a bonding machine as described above with a track which is formed in part by a portable magazine into which a carrier unit can be inserted when the magazine is removed from the machine. The magazine in turn can be readily joined to a fixed track structure in the machine, thereby providing an effective structure for handling the carrier unit outside of the machine and for inserting it into the machine.

The invention is illustrated in the accompanying drawings, but because of the extreme variations in the sizes of various elements, from large to very small, the various figures are drawn to different scales and the scales are not necessarily completely accurate.

The illustrated embodiment of the present invention is a feeding and positioning system for a bonding machine in which header assemblies for semiconductor devices are carried on individual rotary members sandwiched between strip-like members which move easily and without binding along a straight track to a bonding tool. The rotary members are engaged and rotated at the bonding area by gears so as to establish the header assemblies in changed positions for receiving contact wires which are bonded to the assemblies by the bonding tool. The strip members and the rotary members form a carrier unit which is constructed so that when one of the strips is separated from the other, the semiconductor assemblies can be quickly and easily placed on the rotary members, and when the strips are secured together, all of the assemblies are properly retained in place. The carrier unit is inserted into a magazine outside of the bonding machine, and then the magazine is inserted into a fixed track structure in the machine, with the magazine forming part of the complete track. The carrier has a leader strip which extends through the machine and projects from one side such that the leader can be pulled manually to move the carrier by increments in a straight path through the machine so as to supply the semiconductor assemblies to the bonding tool. The gears for rotating the rotary members to establish the semiconductor assemblies in proper positions for bonding the contact wires thereto are positioned on opposite sides of the track and apply balanced forces to opposite sides of the rotary members. The gears are driven by operation of a manual control. The construction of the apparatus is such that there is little or no opportunity for sticking or jamming of the working parts, and this keeps the machine in service for long periods of time without requiring extensive maintenance.

Figure 1:
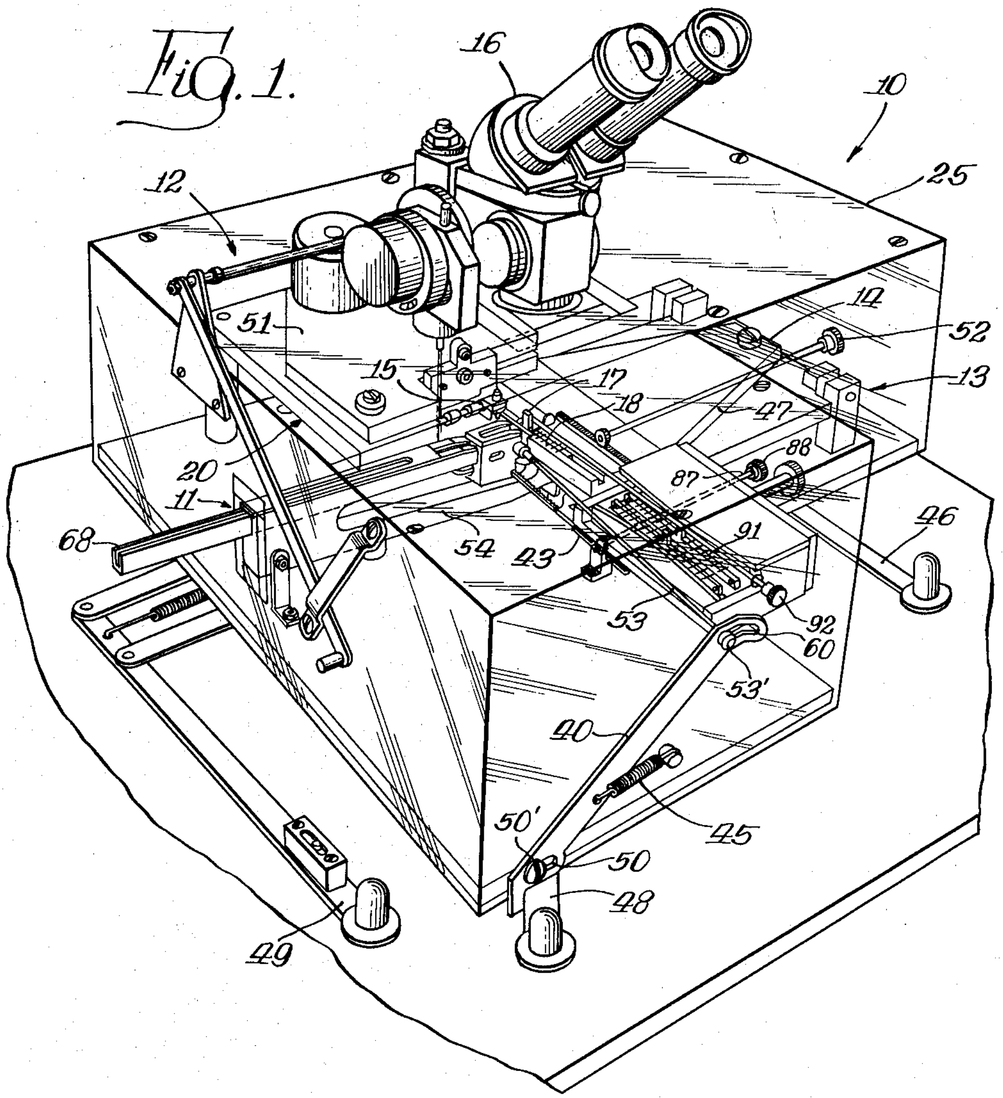
FIG. 1 is a perspective view of a thermal-compression bonding machine provided with a feeding and positioning system in accordance with the invention.

Referring to the drawings, FIG. 1 shows a bonding machine 10 provided with a feeding and positioning system 11 in accordance with the invention. A bonding machine of this type is described and claimed in applicant's copending application Serial No. 794,391, filed on February 19, 1959, now Patent No. 3,051,026. The bonding machine as a whole will be described briefly herein, and the feeding and positioning system 11 will be described fully.

*The Bonding Machine as a Whole*

The feeding and positioning system 11 is one of the main sections of the bonding machine 10, and the machine includes two other main sections identified as 12 and 13. The section 12 includes a micromanipulator 20 for positioning a hammer and bonding point assembly 15 and a microscope 16 with respect to a semiconductor assembly located at the bonding area at any given time. The other section 13 of the machine includes another micromanipulator 14 for positioning a wire holder 17 with respect to the work area. As may be seen in FIGS. 1, 2 and 3, the wire holder 17 has many short wire segments 18 extending from it such that the end portions of the wire segments are available for bonding to the header assemblies 21. As the wire segments on the holder member 17 are used up, the holder is moved with respect to a positioning plate 47 of the micromanipulator 14 so as to supply a fresh wire segment to the work area. A supply of wire holders is stored in a tray 91. When the wires of the holder 17 on the plate 47 are exhausted, it is pulled manually into the tray 91 by operation of a rod 92, and a holder with fresh wires on it is pushed onto plate 47, also by manual operation of rod 92. Other wire feeding systems may be used with the apparatus of the invention if desired.

The machine 10 is almost completely enclosed by a transparent case 25, and the microscope and various controls and levers project outside of the case. A non-oxidizing atmosphere is maintained inside of the case so as to prevent oxidation of the wires which would interfere with the bonding. The atmosphere within the case 25 is maintained clean and relatively dry, and the case keeps out dust and dirt.

Figure 2:
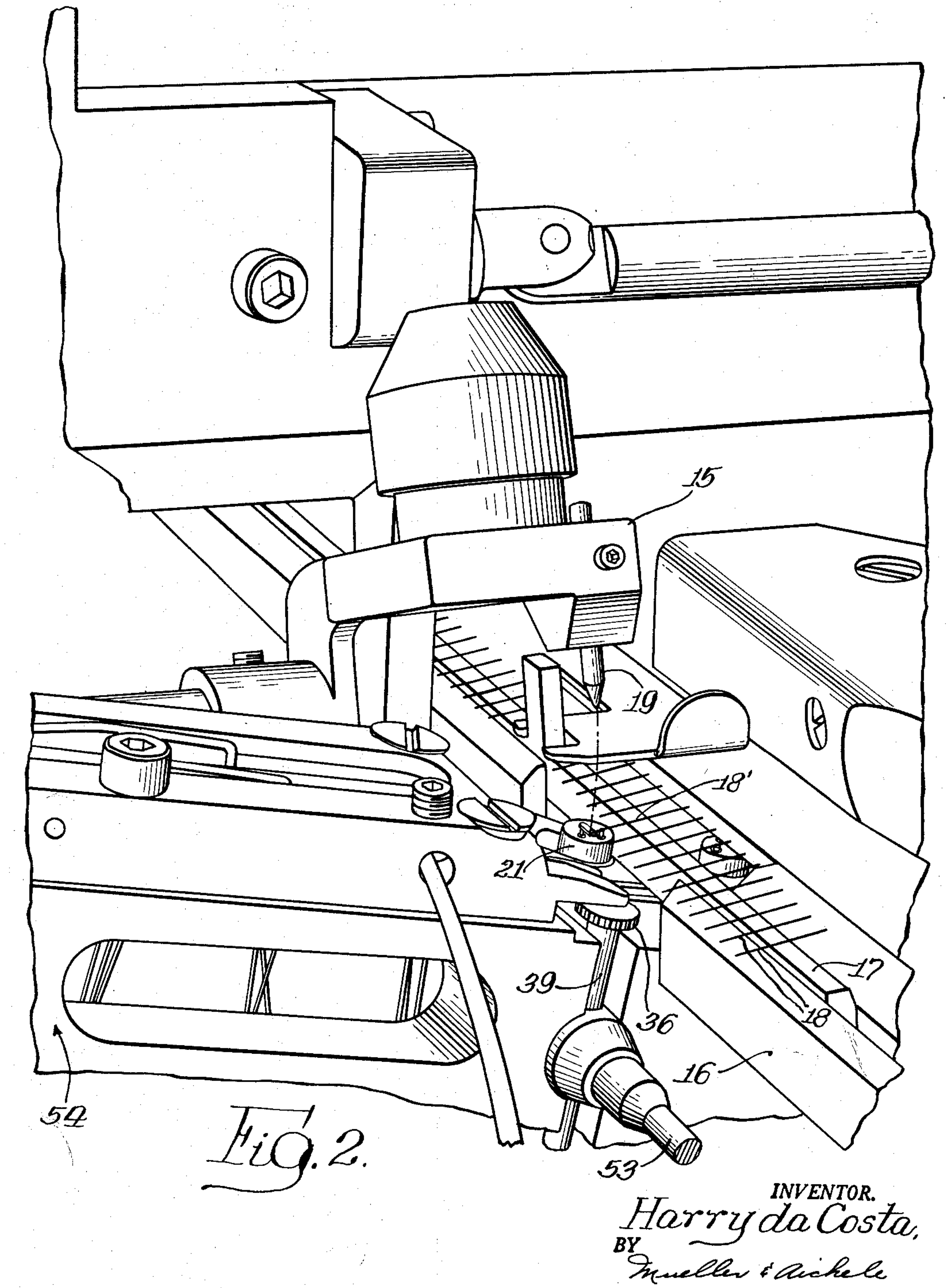
FIG. 2 is an enlarged view of a portion of the machine of FIG. 1 at which the bonding is accomplished, and shows the relative positions of a header assembly, a contact wire, and a bonding tool just prior to the time that a bond is made.
Figures 3, 10:
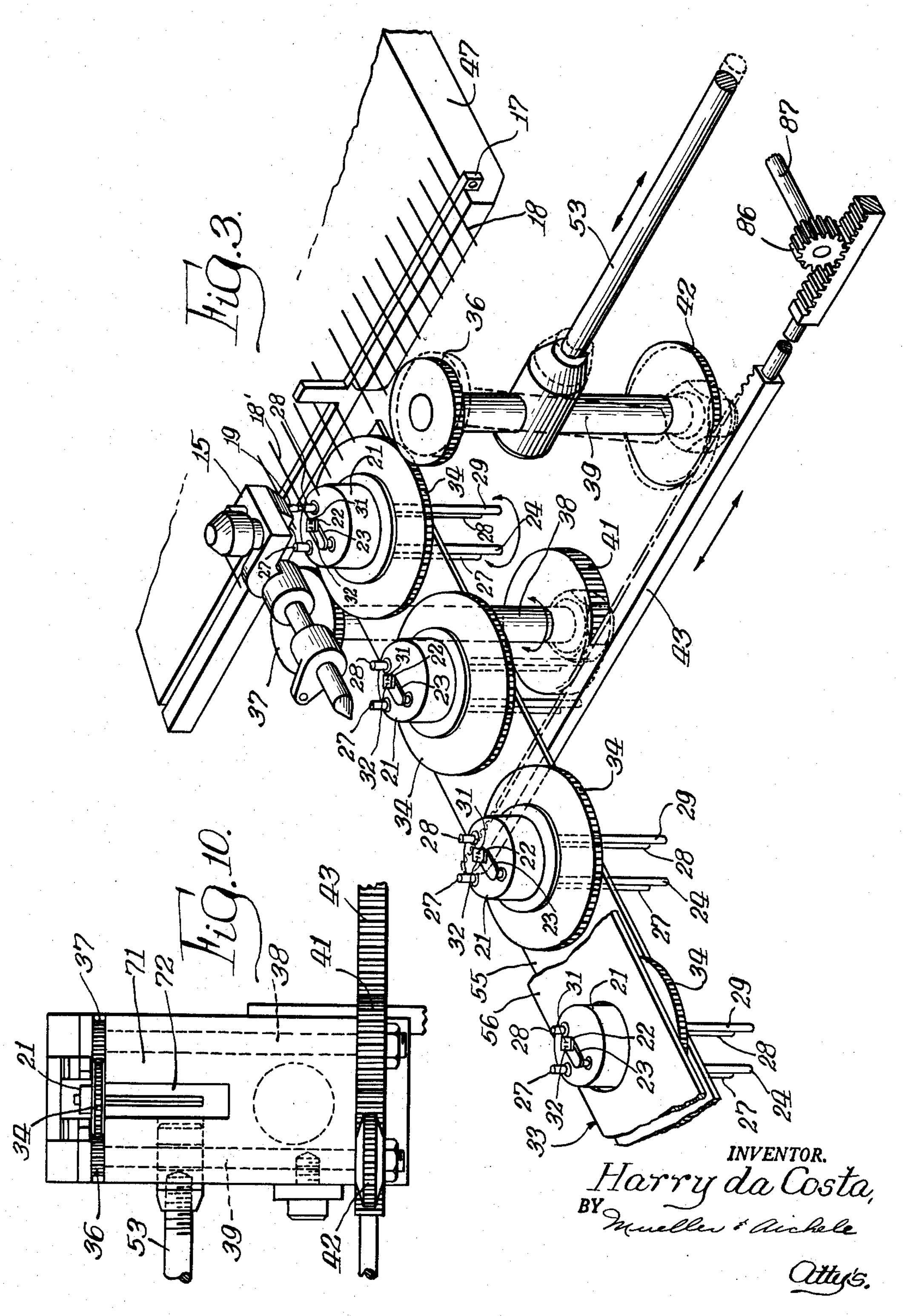
FIG. 3 is a somewhat schematic view of the portion of the machine shown in FIG. 2 and on a distorted scale, and shows in particular a carrier unit with gear-like members supporting the header subassemblies, and a positioning mechanism with gears for rotating the rotary members of the carrier unit at the bonding area.
FIG. 10 is a cross-sectional view of a portion of the track structure taken along line 9—9 of FIG. 8 which shows the manner in which the gears of the positioning mechanism of FIG. 3 are supported.

The relation of a header assembly 21, the bonding tool 19, and a particular contact wire 18' at the time a bond is made is best shown in FIGS. 2 and 3. In FIG. 2, the bonding point 19 of the assembly 15 is in a raised position over a header assembly 21, and in FIG. 3 the bonding point 19 is in a lowered position in which it engages and applies pressure to the wire segment 18' so as to bond it to a lead of the header assembly 21.

Figures 4, 5, 6, 9:
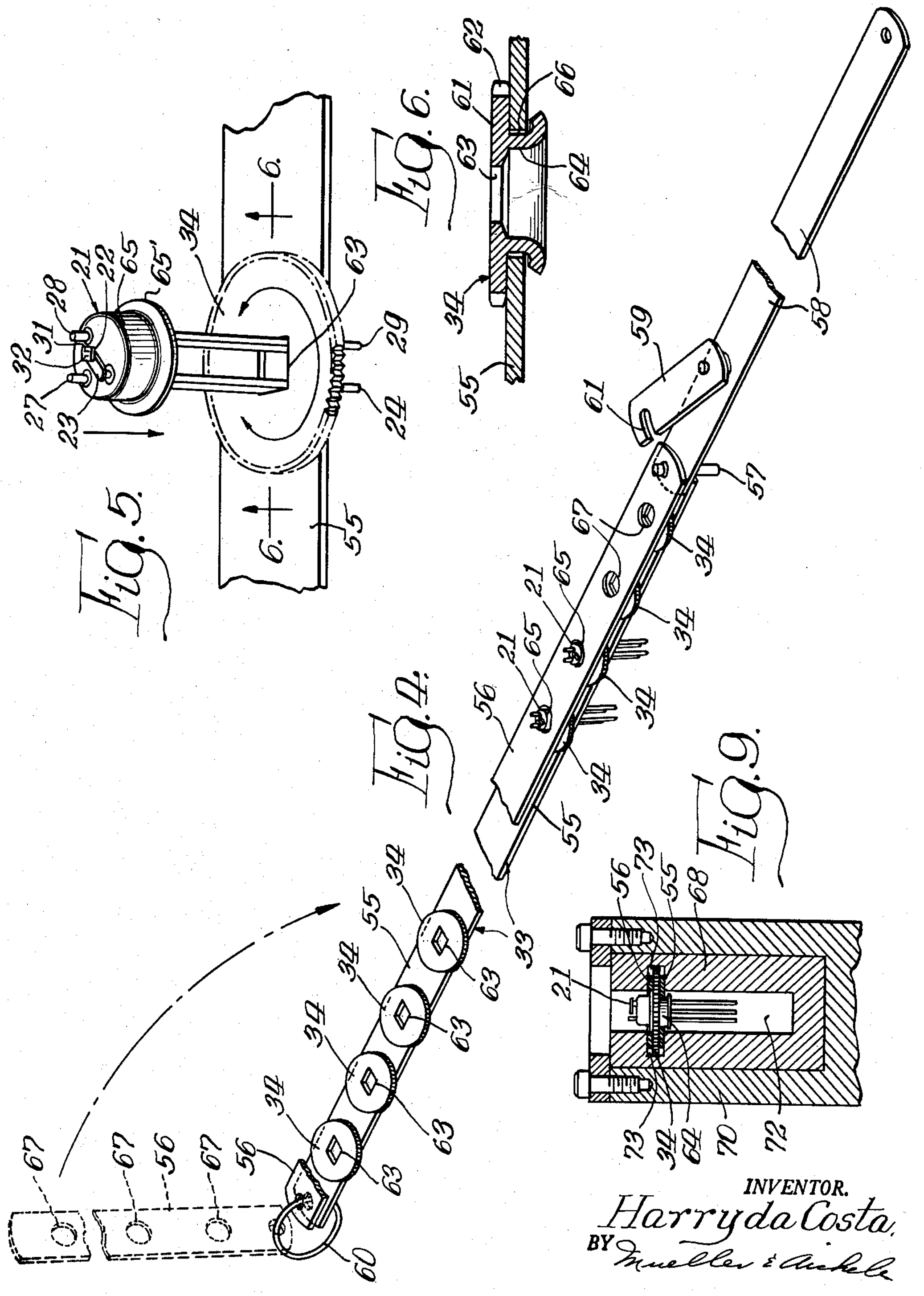
FIG. 4 is a perspective view of the carrier unit on a slightly larger scale than actual size with portions being broken away to show the construction of the unit, and also showing in dotted lines a retainer strip of the carrier unit in a raised position.
FIG. 5 is an enlarged perspective view of one of the gear-like rotary members of the carrier unit showing the manner in which a header assembly is received on the rotary member.
FIG. 6 is a sectional view taken along line 6—6 of FIG. 5 showing the manner in which the rotary member is secured to a supporting strip of the carrier unit.
FIG. 9 is a cross-sectional view of the track structure taken through the magazine portion of the track along line 9—9 of FIG. 8.

The assemblies 21 as shown in FIGS. 2, 3 and 5 are at a stage in the fabrication thereof where they are nearing completion. The remaining major steps required to make the assemblies 21 complete transistor devices are the bonding of contact wires to a semiconductor die unit 22 and to certain lead wires of the assembly as will be explained, and then welding a cover or can to the body of the header assembly to form an enclosure for the die unit and its associated parts.

In the assemblies 21 as supplied to the bonding machine, the tiny die unit 22 is mounted on a heat sink member 23. In the illustrated transistor device, the heat sink 23 is a tab secured to the upper end of an electrical lead 24 which serves as the collector lead of the transistor. The other leads 27, 28 and 29 are respectively the base, emitter and ground leads of the transistor. An emitter junction is formed in the die 22 by a very small deposit of metallic material in the form of a strip 31, and ohmic contact is made to the base region of the die 22 by another small deposit of metallic material in the form of a strip 32 located next to the emitter. Actually, the emitter and base contacts are so minute as to be practically invisible to the eye, but they are shown here for illustrative purposes.

The utility of the machine 10 is not restricted to bonding contact wires to the specific transistor assemblies illustrated herein. Devices with different constructions can be bonded in the machine, and one example of such a device has the heat sink member directly attached to the body of the header and has three lead wires instead of four (the ground or shield lead 29 of the assembly 21 being omitted).

The specific function performed by the machine 10 is to bond one contact wire to the emitter contact 31 and to the upper end of the emitter lead 28, and to bond another contact wire to the base contact 32 and to the upper end of the base lead 27. In accomplishing this, the header assemblies 21 are supplied by a movable carrier unit 33 (FIGS. 3 and 4) in succession to a work position under the bonding tool 19 (FIG. 3), and the header assembly at the work position is rotated to establish it in proper positions for receiving the contact wires. As shown in FIG. 3, each of the header assemblies 21 is mounted on a gear-like rotary member 34 which is engaged by two gears 36 and 37 at the work position. The gears 36 and 37 are connected by shafts 38 and 39 to auxiliary gears 41 and 42 which are driven by a rack 43. Longitudinal movement of the rack 43 drives the gears 36 and 37 causing them to rotate the rotary member 34 at the work position.

The header assembly at the work position under the bonding point 19 is established in one angular position for receiving the emitter contact wire, and then is rotated 90° to a second angular position for receiving the base contact wire. Of course, the angle through which the header assembly is rotated depends on the positions of the leads with respect to the die unit. With the header assembly in a first angular position, as shown in FIG. 3, the wire holder 17 is positioned so that the end of one of the wire segments projecting from it engages the emitter contact 31 on the die unit 22 and extends over the upper end of the emitter lead 28. The very small movements of the holder member 17 necessary to accomplish this positioning are provided by operation of a control lever 46 (see FIG. 1) which moves a positioning plate 47 of the micromanipulator 14 in any horizontal direction. Vertical movement of the wire holder 17 is provided by operation of another control lever 48 (see FIG. 1) which moves the positioning plate 47 in vertical directions. Such movement of the wire segment with respect to the die unit 22 is viewed through the microscope 16 in order to determine when the end of the wire is properly positioned over the emitter contact 31 and the emitter lead 28.

The bonding point 19 must be accurately positioned so that when it is brought down, it will engage the contact wire directly on the place at which the bond is to be made. The positioning of the bonding point is provided by operation of a third control 49 (see FIG. 1) which moves the positioning plate 51 of the micromanipulator 20 in any horizontal direction. The microscope 16 is mounted on the positioning plate 51, and therefore it is also moved upon operation of the control lever 49. The microscope 16 is provided with a target finder such as crosshairs, and the bonding point 19 is established in a predetermined aligned relation with respect to the crosshairs of the microscope so that when the crosshairs are lined up exactly with the place at which the bond is to be made, the bonding point 19 will engage that place when it is lowered. Thus, in order to line up the bonding point with the emitter contact 31, for example, the control 49 is manipulated until the crosshairs of the microscope are precisely aligned with the contact 31 as viewed through the microscope.

After both the bonding point 19 and the end of one of the wires 18 have been properly positioned with respect to the emitter contact 31, the bonding point 19 is lowered and forces the wire against the contact producing a bond. The header assemblies have been heated to a temperature of about 300° C. in the machine as will be explained further, and it is the combination of this heat and the pressure applied by the bonding point which produces the bond.

After the wire segment is bonded to the emitter contact, the bonding tool 19 is moved by operation of the control 46 so as to line it up with the upper end of emitter lead 28. The bonding point 19 is brought down and forces the wire segment against the upper end of the lead producing a bond in the same manner as previously explained. The wire segment is then severed merely by moving the positioning plate 47 so as to tension the wire, and since the bond is stronger than the wire, the tension causes the unbonded end of the wire to break off.

Then the header assembly is rotated 90° to a second position in which the base contact 32 and the base lead 28 are in proper position to receive a contact wire. The wire holder 17 is moved along the positioning plate 47 sufficiently to bring a fresh wire segment to the bonding area, and this movement is provided by turning of a control rod 52 shown in FIGS. 1 and 7. The bonding point 19 and the wire segment 18 are lined up with the base contact 32, and the wire is bonded to the base contact in the same manner as described above. Then the wire is bonded to the base lead 28 and is severed, also as explained above. It will be understood that the specific order of the manipulating operations described above may be varied by the operator if desired, and the order described is only illustrative.

The next header assembly to be bonded is supplied to the work area by moving the carrier unit 33 diagonally to the right as viewed in FIG. 3. The positioning plate 47 is raised by moving the control 48 to the left to the position shown in FIG. 1. This allows the previously bonded header unit to pass under the wire holder 17. The gear 36 is disengaged from the rotary member supporting the previously bonded unit by pulling out on the rod 53 which is connected to the shaft 39. A disengaged position for the gear 36 is shown in dotted lines in FIG. 3. The positioning steps described above are repeated for the new unit and the bonds are made in the same manner.

*The System for Feeding and Positioning Header Assemblies*

The construction of the carrier unit 33 and the manner in which the header assemblies are loaded in it will be described first with reference primarily to FIGS. 3–6, and then the construction of a track structure 54 along which the carrier moves will be described with reference primarily to FIGS. 7–10.

The carrier unit 33 includes a supporting strip or belt 55 which has the gear-like rotary members 34 mounted on it and spaced at regular intervals along its length. The carrier also includes a retainer strip 56 which fits down over the header assemblies 21 and holds them in place on the rotary members 34. The two strips 55 and 56 are secured together at one end by a pin 57 which extends through the end portions of both of the strips as shown in FIG. 4. The pin 57 also secures one end of a leader strip 58 between the supporting strip and the retainer strip. The leader has a clamp member 59 pivotally connected to it, and the clamp 59 has a notched portion 61 which engages the pin 57 and holds it in place. The other end portions of the two strips 55 and 56 are connected together by a ring 60 which serves as a hinge.

In order to load the header assemblies onto the carrier unit 33, the leader strip 58 is detached and the retainer strip 56 is partially detached by removing the pin 57. With the retainer strip 56 moved away from the supporting strip 55 as indicated by the dotted line position of strip 56 in FIG. 4, the header assemblies may be quickly and easily mounted on the rotary members 34 in the manner shown in FIG. 5. Each of the rotary members has a square opening 63 at its center, and the four corners of the opening coincide approximately with the position of the four leads of the header assembly. Thus, the leads of the header assembly may be inserted through the opening 63 as shown in FIG. 5, and when the header is dropped down onto the rotary member 34, the corners of the openings constrain the leads so as to hold the header assembly against rotation with respect to the rotary member.

FIG. 6 shows the construction of the rotary members 34 and how they are mounted on the supporting strip 55. Each rotary member has a disc portion 61 provided with gear teeth 62 on its periphery. The square opening 63 extends through the center of the disc portion. On the bottom side of the disc portion, there is an annular flange 64 which extends through and fits loosely in a circular opening 66 in the supporting strip 55. The lower end of the annular flange 64 is rolled or curled over outwardly so as to hold the member 34 on the strip 55. The diameter of the disc portion 61 is somewhat larger than the width of the two strips 55 and 56 so that the peripheral portion of the members 34 projects slightly beyond the edges of the two strips as shown in FIG. 4. Thus, the members 34 can be engaged by the gears 36 and 37 of the positioning mechanism and rotated freely (see FIG. 3).

After a header assembly has been mounted on each of the rotary members 34, the retaining strip 56 is swung down into position over the supporting strip and the rotary members, and is secured in place together with the leader 58 by inserting the pin 57 and engaging the clamp 59 as previously described. The retaining strip 56 has circular openings 67 spaced along its length at the same intervals as the rotary members 34 are spaced on strip 55, so that when the strip 56 is secured in place over the rotary members, the body 65 of each header assembly projects through a corresponding one of the openings 67. The diameter of the openings 67 is smaller than the diameter of the flange 65′ (FIG. 5) and slightly larger than the main body 65, so that the portions of strip 56 about the openings 67 loosely confine the header assemblies to keep them in place on the rotary members 34.

One of the significant advantages of this construction for the carrier unit is that all of the header assemblies are retained in place by a single retainer element 56 which may be easily secured in place so that the header assemblies can be loaded on the carrier unit in a short time. Another factor contributing to fast loading is that the header assemblies can be loaded in any orientation with respect to the carrier unit because the header assemblies are established in the proper angular positions for bonding after they reach the bonding area.

Figures 7, 8:
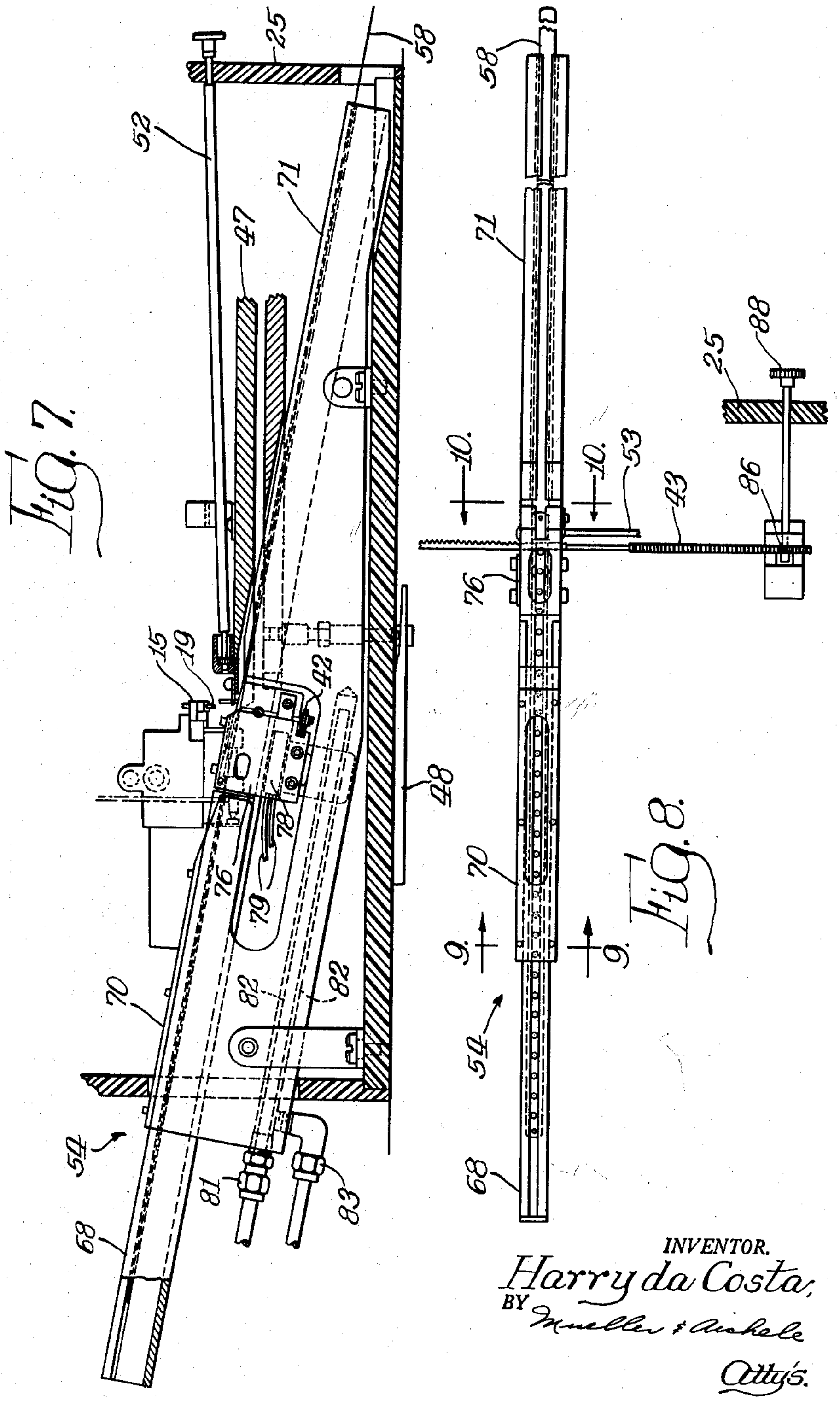
FIG. 7 is a side view of the track structure in the machine of FIG. 1, but enlarged compared to FIG. 1, showing at the left a removable track portion called a magazine which receives the carrier unit and also showing a fixed track portion along which the carrier unit moves through the bonding machine of FIG. 1.
FIG. 8 is a top view of the track structure of FIG. 7.

After the carrier unit 33 is loaded and the retainer strip 56 is secured in place, the unit 33 is inserted into a magazine structure 68 shown in FIGS. 1, 7 and 9. The magazine 68 may be considered as part of the track structure 54, but it is removable from the remainder of the track structure so as to facilitate inserting the carrier. The portion 71 of the track at the right in FIGS. 7 and 8 forms a ramp, and the portion 70 at the left side forms a receptacle for receiving the magazine 68. Both the magazine 68 and the ramp portion 71 of the track structure have a hollow interior which is shaped to define a track along which the carrier unit 33 slides freely. The shape of the track is the same in the magazine 68 and in the ramp portion 71, and this shape is shown best in FIG. 9. There is a vertically extending opening 72 and horizontally extending openings 73 which together form a T-shaped cavity as viewed in cross-section in FIG. 9. The strips 55 and 56 of the carrier unit are constrained between the planar surfaces defining the openings 73 and slide freely along them. The leads of the header assemblies extend down into the vertical opening 72.

The carrier unit 33 is fed into the magazine 68 outside of the machine. Then the magazine with the carrier unit in it is inserted into the receptacle portion 70 of the track structure such that the leader strip 58 extends through the ramp portion 71 and projects from the right hand side of the machine 10 as viewed in FIGS. 7 and 8.

In order to move the carrier unit 33 through the machine, the operator of the machine simply grasps the leader 58 and pulls it to the right. It may be noted in FIG. 7 that the underside of the positioning plate 47 is cut out so that there is room for the header assembly to pass underneath it. The bonded header assemblies slide along the ramp section 71 of the track unit and emerge from the side of the machine opposite the side on which they are inserted. The carrier unit 33 moves easily so that the operator can make such back and forth adjustments of the carrier as are necessary in order to locate a header assembly directly underneath the bonding point 19. This smooth operation is possible even though the carrier and track are not lubricated.

Referring to FIGS. 7 and 8, it may be seen that the fixed portion of the track structure 54 also includes a heater section 76. The heater section 76 includes a heating element 78 which is energized by electrical current supplied through the lead wires 79. The heat from the element 78 is transmitted through heat conductive material of the heater section and the carrier unit to the header assemblies. The heating is sufficient to raise the temperature of the die unit 22 of the header assembly to a temperature in the vicinity of 300° C., and this has been found to be a satisfactory ambient temperature for thermal compression bonding. Water is supplied to a fitting 81 and flows through a passage 82 and out another fitting 83 for the purpose of cooling the main body of the track structure. The magazine 68 extends to the heater section of the track, and the surfaces which define the track are formed in the magazine, the heater section and the ramp section.

FIGS. 3, 7, 8, 9 and 10 provide a complete illustration of the positioning mechanism for establishing the header assemblies in the proper positions to receive the contact wires. The two gears 36 and 37 which are engaged with the teeth of the rotary members 34 when they reach the bonding area are received in recesses at the top of the track structure, as shown in FIG. 10. Gear 36 is on one side of the track and gear 37 is on the other side so that the gears 36 and 37 engage the rotary members 34 on opposite sides. Thus, the forces applied to the rotary member 34 by the gears are balanced, and this insures easy rotation of the rotary members with little or no tendency for jamming.

The two shafts 38 and 39 on which the gears 36 and 37 are respectively mounted extend down through the heater section and are connected to the two auxiliary gears 41 and 42. The rack 43 for driving the gears is movable longitudinally in a recess located adjacent the two gears 41 and 42. When the rack 43 is moved diagonally to the left as viewed in FIG. 3 (to the right in FIG. 10), the gears 36, 37, 41 and 42 all rotate in the same direction, and this causes opposite rotation of the rotary member 34 engaged therewith. The rack 43 is driven by a pinion gear 86 (FIG. 3) which in turn is driven by a shaft 87 extending to the outside of the case for the machine and having a knob 88 on its end. (See FIG. 8.)

The gear 36 may be engaged and disengaged with the rotary members by operation of the control rod 53. The rod 53 is connected to the shaft 39 and extends therefrom to the outside of the case for the machine. The rod 53 is spring-biased toward the track structure, and this keeps the gears 37 and 36 firmly engaged with the teeth of the rotary member 34. When the rod 53 is moved outwardly, the gear 36 and the shaft 39 are disengaged from the rotary member. This is accomplished by moving the control 48 a little farther to the left than the position shown in FIG. 1. The control 48 engages a movable link 40 and moves it to the left against the force of the spring 45. The movement of the link is guided by a slot 50 which receives a screw 50′. The rod 53 extends through a slot 60 at the upper end of the link 40 and a nut 53′ on shaft 53 fits against the link. The end of the link is bent outwardly at about the middle of the slot 60. When the link 40 is moved to the left, the nut 53′ rides in the slot 60, and as it is engaged by the bent portion of the link, the rod 53 is pulled out, thereby disengaging the gear 36.

It may be seen from the foregoing description that the feeding and positioning system of the invention supplies the semiconductor assemblies to the bonding area and positions them quickly and accurately. The carrier unit can be loaded in a very short time and can be handled and inserted into the bonding machine easily. The header assemblies are retained on the carrier unit by a single element which is built into the carrier unit, and there is no need to load the header assemblies in any specific orientation, all of which saves time and labor. The carrier unit moves easily along smooth surfaces of the track structure in a straight path, and the rotary members which carry the header assemblies are positioned by gears which apply balanced loads to it such that the carrier unit and the positioning mechanism operate smoothly. The construction of the system is not unduly complex, and it can be fabricated quite economically.

I claim:

1. Apparatus for supplying incomplete assemblies for semiconductor devices to a work area in an assembly machine and for positioning the assemblies at the work area with respect to a contact wire to be attached thereto, said apparatus including in combination, an elongated carrier, a plurality of rotary members supported by said carrier in positions spaced along the length thereof, said rotary members each having means for receiving and supporting one of the aforesaid assemblies, track means forming a straight track for supporting said carrier and having guiding surfaces on which said carrier is slidable permitting smooth incremental longitudinal movement of said carrier in a straight line path through said work area, so that said carrier is adapted to move said rotary members in succession to and past a work position at the aforesaid work area, driving means positioned at the work area and selectively engageable with said rotary members in said work position thereof, and control means operatively connected to said driving means and operable in a controlled manner to actuate said driving means and rotate a rotary member engaged thereby in order to establish an assembly provided on such rotary member in a first position for attaching one contact wire thereto and in a second position spaced angularly a predetermined distance from said first position for attaching another contact wire thereto.

2. Apparatus for supplying incomplete assemblies for semiconductor devices to a work area in an assembly machine and for positioning the assemblies at the work area with respect to a contact wire to be attached thereto, said apparatus including in combination, means forming a straight track extending through the work area, and elongated carrier structure movable longitudinally along said track and having a plurality of rotary members supported in positions spaced along the length thereof, said rotary members each having means for receiving and supporting one of the aforesaid assemblies and having a circular peripheral portion extending transversely of said carrier structure and provided with gear teeth, means for moving said carrier structure incrementally along said track for establishing said rotary members in succession in a work position at the aforesaid work area, first and second gears positioned on opposite sides of the path of movement of said rotary members and located at the work area, said gears being engageable with said gear teeth of said rotary members on opposite sides of said peripheral portions thereof and applying balanced loads to said rotary members, control means operatively connected to said first and second gears for rotating the same and a rotary member engaged thereby in order to establish an assembly provided on such rotary member in a first position for attaching one contact wire thereto and in a second position spaced angularly from said first position for attaching another contact wire thereto, and operating means operatively connected to one of said first and second gears for moving the same in a direction transversely of said track to establish a rotary member and said gears in an engaged condition for rotationally positioning said rotary member and in a disengaged position for releasing such rotary member for movement along said track.

3. Apparatus for supplying incomplete assemblies for semiconductor devices to a work area in an assembly machine at which contact wires are to be attached to the assemblies, said apparatus including in combination, means forming an elongated straight track extending through the work area, a carrier unit comprising an elongated supporting strip, a plurality of gear-like rotary members supported on said strip in positions spaced at intervals along the length thereof and having toothed portions projecting laterally from said strip, said rotary members each having means for receiving one of the aforesaid assemblies thereon, an elongated retaining strip having openings through the same spaced along the length thereof at the same intervals as said rotary members, means for detachably securing said retainer strip in spaced parallel relation with said supporting strip and with said rotary members between said strips for retaining the assemblies on said rotary members with portions of the assemblies to which contact wires are to be attached projecting through said openings, and means connected to said strips for providing incremental movement thereof along said track for moving said rotary members to a work position at the work area, gear means including first and second gears located at the work area on opposite sides of the path of movement of said rotary members and engageable with the toothed portion of a rotary member on opposite sides thereof for turning such rotary member smoothly with balanced side loads, driving means coupled to said gear means for rotating the same and a rotary member engaged thereby in order to establish an assembly provided on such rotary member in a first position for attaching one contact wire thereto and in a second position spaced angularly a predetermined distance from said first position for attaching another contact wire thereto, and operating control means coupled to said first gear for moving the same laterally with respect to said track to establish said gears and the toothed portion of a rotary member in an engaged condition for permitting rotational positioning of such rotary member and in a disengaged condition for permitting movement of such rotary member along said track.

4. Apparatus for supplying incomplete assemblies for semiconductor devices to a work area in an assembly machine and for positioning the assemblies at the work area with respect to a contact wire to be attached thereto, said apparatus including in combination, an elongated carrier, a plurality of rotary members supported by said carrier in positions spaced along the length thereof, said rotary members each having means for receiving and supporting one of the aforesaid assemblies and having a gear-like toothed portion, track means having an elongated substantially straight track formed therein for receiving said carrier and permitting incremental longitudinal movement of said carrier along said track for moving said rotary members to a work position at the work area, said track means including a fixed portion having one part of said track formed therein and a portable magazine portion having another part of said track formed therein, said magazine portion being removable from said fixed track portion so as to permit insertion of the carrier structure into said magazine outside of the machine, driving means supported at the work area and engageable with a rotary member in the work position thereof, and control means operatively connected to said driving means for rotating the same and a rotary member engaged thereby in a controlled manner in order to establish an assembly provided on such rotary member in a first position for receiving one contact wire and in a second position spaced angularly a predetermined distance from said first position for receiving another contact wire.

5. In an assembly machine for performing an assembly operation on incomplete semiconductor devices at a work area within the machine, the means for supplying said devices and wire to be assembled therewith to said work area including in combination a carrier unit comprising a pair of relatively rigid superimposed straight metal strips adapted to have a plurality of semiconductor devices supported thereon in spaced-apart relation, a plurality of movable means in the carrier unit and each having a portion positioned between said strips and adapted to directly support a semiconductor device thereon with portions of such devices retained in position by said strips, means in the machine for directing the carrier unit in a straight line as it is moved through the machine past the work area, wire applying means in the machine for applying a piece of wire to a device at the machine work area, and further means in said machine for selectively actuating a movable means and moving a device therewith from one position to another for the application of another piece of wire thereto as an incident to the functioning of the machine in an assembly operation.

6. In an assembly machine for assembling wires with incomplete semiconductor devices and for attaching the wires to the devices, the combination including a carrier unit comprising a pair of superposed straight strips of relatively rigid material adapted to support a plurality of semiconductor devices and to carry the same to a work area in the machine, said strips each having openings therein spaced along the length thereof with each said opening in one strip being opposite a corresponding opening in the other strip, whereby said strips are adapted to retain the semiconductor devices between the same with portions of said devices projecting in opposite directions through said openings so that at least one such portion of each device is available to have a wire assembled thereto in the machine, said strips being removable from the machine and detachable from each other to facilitate the placement of semiconductor devices between said strips, means in the machine for directing the carrier unit in a straight line as it is moved incrementally through the machine to and past the work area, wire applying means in the machine for applying the wire to a device at the machine work area, and a bonding tool in the machine operable to apply pressure to the wire upon assembly thereof at the machine work area with a semiconductor device to bond such wire to the device.

7. In an assembly machine for assembling wires with incomplete semiconductor devices and for attaching the wires to the devices, the combination including a carrier unit comprising a pair of superposed straight strips of substantially rigid material adapted to support a plurality of semiconductor devices and carry the same to a work area in the machine, said strips having opposed openings therein spaced along the length thereof so that said strips are adapted to retain the semiconductor devices between the same with portions of each device projecting in opposite directions through the respective strip-openings so that one such portion is available to have a wire assembled thereto, and said strips being removable from the machine to facilitate the placing of semiconductor devices between said strips, means forming a straight track in the machine leading to and past the work area therein with said carrier unit being movable incrementally along said track in a straight line to and past the work area, said track means including a portable portion which is removable from the machine so as to permit handling of said carrier unit therein outside of the machine, wire applying means in the machine for applying a piece of wire to a device at the machine work area, and a bonding tool in the machine operable to attach such wire to a device at the machine work area.

8. An assembly machine for assembling wires with incomplete semiconductor devices and for attaching the wires to the devices, including in combination, a carrier unit comprising a pair of superposed straight strips of relatively rigid material adapted to support a plurality of semiconductor devices and to carry the same to a work area in the machine, said strips having opposed openings therein and spaced along the length thereof so that said strips are adapted to retain the semiconductor devices between the same with portions of each device projecting in opposite directions through the respective strip-openings so that one such portion is available to have a wire assembled thereto, and said strips being removable from the machine to facilitate the placing of semiconductor devices between said strips, means forming a straight track extending to and through the work area in the machine for directing the carrier unit in a straight line as it is moved incrementally through the machine to and past the work area, wire applying means for applying wire to a semiconductor device at the machine work area, and a bonding tool in the machine operable to attach such wire to a device at the machine work area.

9. The assembly machine of claim 8 in which one of the strips of said carrier unit has a plurality of rotary gear members secured thereto at the openings in said strip, with said gear members each having a corresponding opening therein for receiving a portion of a semiconductor device, and said machine having driving means at the work area therein selectively engageable with said rotary members and operable to establish a device provided on such rotary member in a first position for attaching one wire thereto and in a second position for attaching another wire thereto.

References Cited in the file of this patent

UNITED STATES PATENTS

| | | |
|---|---|---|
| 2,508,259 | Helme | May 16, 1950 |
| 2,554,982 | Hartley | May 29, 1951 |
| 2,853,769 | Stahl | Sept. 30, 1958 |